US007073156B2

(12) United States Patent
Wheeler et al.

(10) Patent No.: US 7,073,156 B2
(45) Date of Patent: Jul. 4, 2006

(54) GATE ESTIMATION PROCESS AND METHOD

(75) Inventors: William R. Wheeler, Southborough, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/941,519

(22) Filed: Aug. 29, 2001

(65) Prior Publication Data

US 2003/0046652 A1 Mar. 6, 2003

(51) Int. Cl.
G06F 17/50 (2006.01)
H03K 19/00 (2006.01)

(52) U.S. Cl. .................... 716/17; 716/2; 716/4; 716/1

(58) Field of Classification Search ............ 716/17, 716/2, 4, 1
See application file for complete search history.

(56) References Cited

U.S. PATENT DOCUMENTS

| 4,703,435 | A | 10/1987 | Darringer et al. |
| 4,970,664 | A | 11/1990 | Kaiser et al. |
| 5,128,871 | A | 7/1992 | Schmitz |

(Continued)

FOREIGN PATENT DOCUMENTS

| EP | 0 404 482 | 12/1990 |
| EP | 0 433 066 | 6/1991 |
| EP | 0 720 233 | 7/1996 |
| EP | 0 901 088 | 3/1999 |
| EP | 1 065 611 | 1/2001 |
| JP | 58-060559 | 4/1983 |
| JP | 03-225523 | 10/1991 |
| JP | 07-049890 | 2/1995 |
| JP | 08-314892 | 11/1996 |
| JP | 2001-068994 | 3/2001 |
| WO | WO 98/37475 | 8/1998 |
| WO | WO 98/55879 | 12/1998 |
| WO | WO 99/39268 | 8/1999 |
| WO | WO 00/65492 | 11/2000 |

OTHER PUBLICATIONS

Renoir—Mentor Graphics, web site.
Foley et al., "An Object Based Graphical User Interface for Power Systems", IEEE Transactions on Power Systems, vol. 8, No. 1, Feb. 1993, pp. 97–104.
Pedram et al., "Floorplanning with Pin assignment", 1990 IEEE International Conference on Computer–Aided Design, Nov. 11, 1990, pp. 98–101.
Renoir, HDL Design Datasheet, Mentor Graphics, 1–8, 1999.
Mentor Graphics Corporation, Renoir™ With HDL2Graphics™, pp. 1–6, 1998, Oregon.

(Continued)

Primary Examiner—Matthew Smith
Assistant Examiner—A. M. Thompson
(74) Attorney, Agent, or Firm—Fish & Richardson P.C.

(57) ABSTRACT

A circuit design parameter file is maintained for a circuit being designed by a circuit designer. This circuit design parameter file specifies a physical characteristic of the circuit. A design environment is monitored to detect the addition of a circuitry component to the circuit and a component design parameter file that specifies at least one design parameter for that added circuitry component is accessed. The circuit design parameter file is updated based on the design parameter(s) included in the component design parameter file. The circuit designer is provided with feedback concerning the physical characteristic of the circuit being designed.

14 Claims, 6 Drawing Sheets

U.S. PATENT DOCUMENTS

| | | | |
|---|---|---|---|
| 5,212,650 A | 5/1993 | Hooper et al. | |
| 5,220,512 A | 6/1993 | Watkins et al. | |
| 5,258,919 A | 11/1993 | Yamanouchi et al. | |
| 5,267,175 A | 11/1993 | Hooper | |
| 5,269,857 A | 12/1993 | Ganesh et al. | |
| 5,278,769 A | 1/1994 | Bair et al. | |
| 5,287,289 A | 2/1994 | Kageyama et al. | |
| 5,297,053 A | 3/1994 | Pease et al. | |
| 5,301,318 A | 4/1994 | Mittal | |
| 5,384,710 A | 1/1995 | Lam et al. | |
| 5,422,833 A * | 6/1995 | Kelem et al. | 703/14 |
| 5,475,605 A | 12/1995 | Lin | |
| 5,493,507 A | 2/1996 | Shinde et al. | |
| 5,506,788 A | 4/1996 | Cheng et al. | |
| 5,513,119 A * | 4/1996 | Moore et al. | 716/8 |
| 5,528,177 A * | 6/1996 | Sridhar et al. | 326/113 |
| 5,544,067 A | 8/1996 | Rostoker et al. | |
| 5,553,002 A | 9/1996 | Dangelo et al. | |
| 5,568,397 A | 10/1996 | Yamashita et al. | |
| 5,598,347 A | 1/1997 | Iwasaki | |
| 5,603,015 A | 2/1997 | Kurosawa et al. | |
| 5,604,894 A | 2/1997 | Pickens et al. | |
| 5,629,857 A | 5/1997 | Brennan | |
| 5,663,662 A | 9/1997 | Kurosawa | |
| 5,666,289 A * | 9/1997 | Watkins | 716/8 |
| 5,673,198 A | 9/1997 | Lawman et al. | |
| 5,685,006 A | 11/1997 | Shiraishi | |
| 5,694,579 A | 12/1997 | Razdan et al. | |
| 5,706,476 A | 1/1998 | Giramma | |
| 5,717,928 A | 2/1998 | Campmas et al. | |
| 5,724,250 A | 3/1998 | Kerzman et al. | |
| 5,757,655 A * | 5/1998 | Shih et al. | 716/2 |
| 5,809,283 A | 9/1998 | Vaidyanathan et al. | |
| 5,828,581 A * | 10/1998 | Matumura | 716/12 |
| 5,831,869 A | 11/1998 | Ellis et al. | |
| 5,841,663 A | 11/1998 | Sharma et al. | |
| 5,852,564 A | 12/1998 | King et al. | |
| 5,889,677 A | 3/1999 | Yasuda et al. | |
| 5,892,678 A * | 4/1999 | Tokunoh et al. | 716/2 |
| 5,892,682 A | 4/1999 | Hasley et al. | |
| 5,903,469 A * | 5/1999 | Ho | 716/5 |
| 5,910,898 A * | 6/1999 | Johannsen | 716/1 |
| 5,933,356 A | 8/1999 | Rostoker et al. | |
| 5,937,190 A | 8/1999 | Gregory et al. | |
| 5,963,724 A | 10/1999 | Mantooth et al. | |
| 5,974,242 A | 10/1999 | Damarla et al. | |
| 6,044,211 A | 3/2000 | Jain | |
| 6,053,947 A | 4/2000 | Parson | |
| 6,066,179 A * | 5/2000 | Allan | 716/4 |
| 6,077,304 A | 6/2000 | Kasuya | |
| 6,106,568 A | 8/2000 | Beausang et al. | |
| 6,117,183 A | 9/2000 | Teranishi et al. | |
| 6,120,549 A * | 9/2000 | Goslin et al. | 703/20 |
| 6,132,109 A | 10/2000 | Gregory et al. | |
| 6,135,647 A | 10/2000 | Balakrishnan et al. | |
| 6,152,612 A | 11/2000 | Liao et al. | |
| 6,161,211 A | 12/2000 | Southgate | |
| 6,178,541 B1 | 1/2001 | Joly et al. | |
| 6,205,573 B1 | 3/2001 | Hasegawa | |
| 6,208,954 B1 | 3/2001 | Houtchens | |
| 6,216,256 B1 | 4/2001 | Inoue et al. | |
| 6,219,822 B1 | 4/2001 | Gristede et al. | |
| 6,226,780 B1 | 5/2001 | Bahra et al. | |
| 6,233,540 B1 | 5/2001 | Schaumont et al. | |
| 6,233,723 B1 * | 5/2001 | Pribetich | 716/17 |
| 6,234,658 B1 | 5/2001 | Houldsworth | |
| 6,236,956 B1 | 5/2001 | Mantooth et al. | |
| 6,260,179 B1 | 7/2001 | Ohsawa et al. | |
| 6,272,671 B1 | 8/2001 | Fakhry | |
| 6,275,973 B1 | 8/2001 | Wein | |
| 6,292,931 B1 | 9/2001 | Dupenloup | |
| 6,298,468 B1 | 10/2001 | Zhen | |
| 6,311,309 B1 | 10/2001 | Southgate | |
| 6,324,678 B1 | 11/2001 | Dangelo et al. | |
| 6,327,693 B1 | 12/2001 | Cheng et al. | |
| 6,353,806 B1 | 3/2002 | Gehlot | |
| 6,353,915 B1 | 3/2002 | Deal et al. | |
| 6,360,356 B1 | 3/2002 | Eng | |
| 6,366,874 B1 | 4/2002 | Lee et al. | |
| 6,378,115 B1 | 4/2002 | Sakurai | |
| 6,381,563 B1 | 4/2002 | O'Riordan et al. | |
| 6,381,565 B1 | 4/2002 | Nakamura | |
| 6,401,230 B1 | 6/2002 | Ahanessians et al. | |
| 6,421,816 B1 | 7/2002 | Ishikura | |
| 6,438,729 B1 * | 8/2002 | Ho | 716/1 |
| 6,438,731 B1 | 8/2002 | Segal | |
| 6,440,780 B1 | 8/2002 | Kimura et al. | |
| 6,449,762 B1 | 9/2002 | McElvain | |
| 6,457,164 B1 | 9/2002 | Hwang et al. | |
| 6,473,885 B1 | 10/2002 | Wallace | |
| 6,477,683 B1 | 11/2002 | Killian et al. | |
| 6,477,688 B1 | 11/2002 | Wallace | |
| 6,477,689 B1 | 11/2002 | Mandell et al. | |
| 6,480,985 B1 | 11/2002 | Reynolds et al. | |
| 6,487,698 B1 | 11/2002 | Andreev et al. | |
| 6,490,545 B1 | 12/2002 | Peng | |
| 6,505,328 B1 | 1/2003 | Van Ginneken et al. | |
| 6,505,341 B1 | 1/2003 | Harris et al. | |
| 6,516,456 B1 | 2/2003 | Garnett et al. | |
| 6,519,742 B1 | 2/2003 | Falk | |
| 6,519,755 B1 | 2/2003 | Anderson | |
| 6,523,156 B1 | 2/2003 | Cirit | |
| 6,539,536 B1 | 3/2003 | Singh et al. | |
| RE38,059 E | 4/2003 | Yano et al. | |
| 6,546,528 B1 | 4/2003 | Sasaki et al. | |
| 6,574,787 B1 | 6/2003 | Anderson | |
| 6,591,407 B1 | 7/2003 | Kaufman et al. | |
| 2001/0018758 A1 * | 8/2001 | Tanaka et al. | 716/6 |
| 2001/0029603 A1 * | 10/2001 | Uota | 717/1 |
| 2002/0023256 A1 | 2/2002 | Seawright | |
| 2002/0038447 A1 | 3/2002 | Kim et al. | |
| 2002/0042904 A1 | 4/2002 | Ito et al. | |
| 2002/0046386 A1 | 4/2002 | Skoll et al. | |
| 2002/0049957 A1 * | 4/2002 | Hosono et al. | 716/5 |
| 2002/0053063 A1 * | 5/2002 | Bhattacharya et al. | 716/1 |
| 2002/0059054 A1 | 5/2002 | Bade, et al. | |
| 2002/0112221 A1 | 8/2002 | Ferreri et al. | |
| 2002/0138244 A1 | 9/2002 | Meyer | |
| 2002/0166100 A1 | 11/2002 | Meding | |
| 2003/0004699 A1 | 1/2003 | Choi et al. | |
| 2003/0005396 A1 | 1/2003 | Chen et al. | |
| 2003/0016206 A1 | 1/2003 | Taitel | |
| 2003/0016246 A1 | 1/2003 | Singh | |
| 2003/0036871 A1 | 2/2003 | Fuller et al. | |
| 2003/0177455 A1 | 9/2003 | Kaufman et al. | |

OTHER PUBLICATIONS

Mentor Graphics Corporation, Renoir HDL Design Datasheet, pp. 1–2, 1999, Oregon.

Computer Design, "After Hard Knocks, Cycle–Based Simulators Stand Their Ground". http://www.computer-design.com/Editoral/1996/10/ASIC/after.html, accessed on Aug. 23, 2001, pages 1–5.

Gassenfeit, E. H., "Control System Design Realization via VHDL–A: Requirements", Proceedings of the 1996 IEEE International Symposium on Computer–Aided Control System Design, Sep. 15, 1996, pp. 282–285.

Kutzschebauch, "Efficient logic optimization using regularity extraction", Proceedings of 2000 International Conference on Computer Design, Sep. 17, 2000, pp. 487–493.

Lahti, et al., "SADE: a Graphical Toll for VHDL–Based System Analysis", 1991 IEEE International Conference on Computer–Aided Design, Nov. 11, 1991, pp. 262–265.

Lin, et al., "A Goal Based High–Level Test Planning System for DSP Real Number Models", 1998 Proceedings of International Test Conference, Oct. 18, 1998, pp. 1000–1009.

Maxfield, C., "Digital Logic Simulation: Event–Driven, Cycle–Based, and Home–Brewed", *Electrical Design News*, 41(14):129–136 (1996).

NB84035598, "Binary Relational Schema to Model Structured LSI Design", IBM Technical Disclosure Bulletin, vol. 26, No. 10B, Mar. 1984, pp. 5598–5601.

NN7807629, "Functional Oriented Symbolic Macromodeling Algorithm", IBM Technical Disclosure Bulletin, vol. 21, No. 2, Jul. 1978, pp. 629–631.

NN8006341, "Macro Physical–To–Logical Checking LSI Chip Design", IBM Technical Disclosure Bulletin, vol. 23, No. 1, Jun. 1980, pp. 341–345.

NN9407481, "Functional modeling using object Collaboration Diagram", IBM Technical Disclosure Bulletin, vol. 37, No. 7, Jul. 1994, pp. 481–486.

Parlakbilek, et al., "A Multiple–Strenght Multiple–Delay Compiled–Code Logic Simulator", *IEEE Transactions on Computer–Aided Design of Integrated Circuits and Systems*, 12(12):1937–1946 (1993).

Su, Stephen, "An Interactive Design Automation System", *Proceedings of the 10th Design Automation Workshop on Design Automation*, pp. 253–261, Jun. 1973.

Yli–Pietila, et al., "The Design and Stimualtion of Complex Multitechnology Systems", IEEE International COnference on Systems Engineering, Aug. 9, 1990, pp. 474–477.

* cited by examiner

GATE ESTIMATION PROCESS AND METHOD

BACKGROUND

Integrated circuits typically incorporate various combinational elements (e.g., AND gates, OR gates, NAND gates, XOR gates, etc.) and state elements (e.g., latches, flip-flops, etc.) in their design. Each of these combinational and state elements are discrete elements that the engineer places into the circuit design.

The silicon wafers used in semiconductor chips have a finite surface area and each element (i.e., combinational and state) etched into these silicon wafers occupies a portion of that surface area. Accordingly, only a finite number of elements can be placed on one of these silicon wafers.

DETAILED DESCRIPTION

Figure 1:
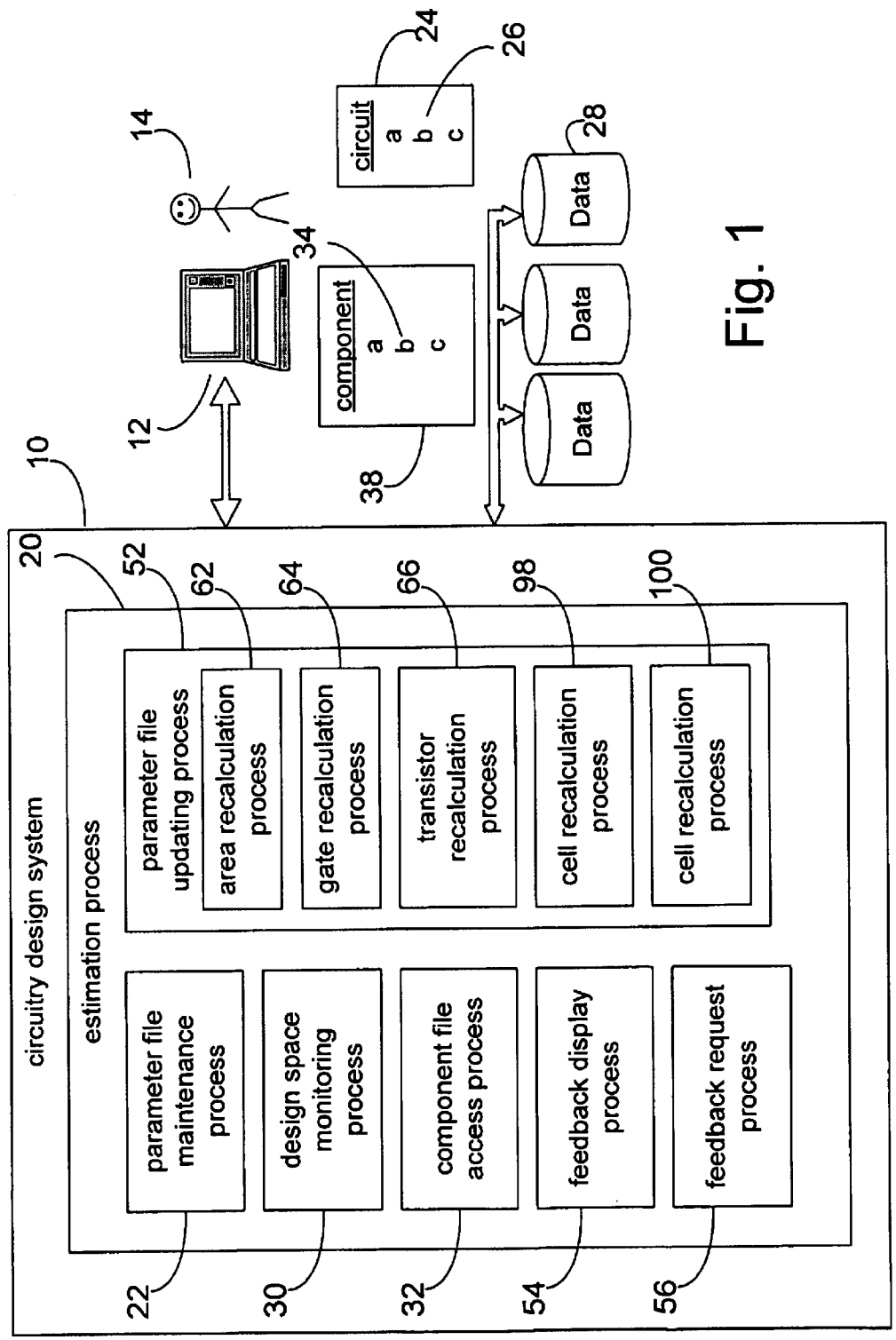
FIG. 1 is a diagrammatic view of the estimation process.
Figure 2:
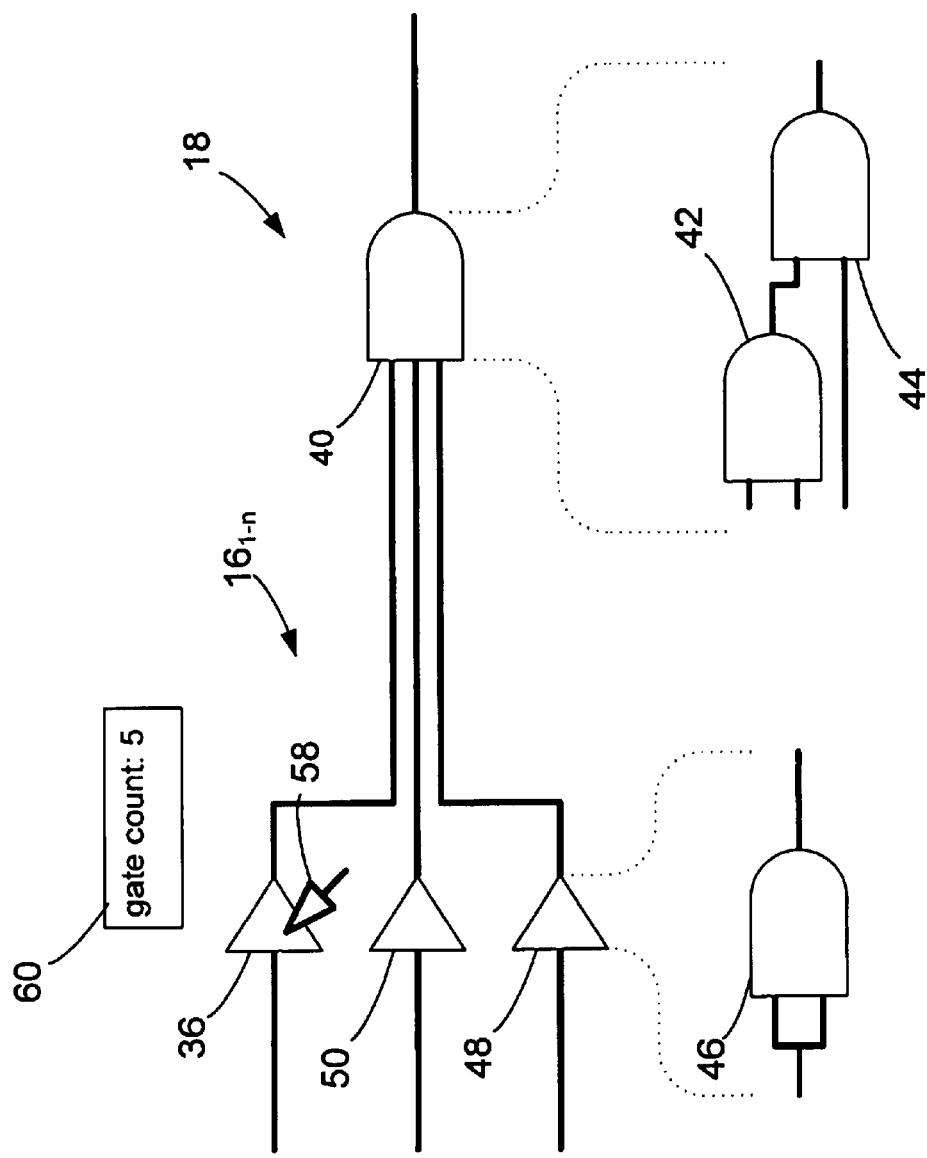
FIG. 2 is a diagrammatic view of the design space of the estimation process.

Referring to FIGS. 1 and 2, there is shown a circuitry design system 10 that operates on a computer system 12 (e.g., a laptop computer, desktop computer, mainframe/thin client, etc.). A circuit designer 14 (e.g., a hardware engineer, a software engineer, etc.) utilizes circuitry design system 10 to design electronic circuits that may be incorporated into semiconductor devices, mounted on printed circuit boards, etc.

As circuitry design system 10 is a graphical system, designer 14 positions graphical representations of various circuitry components $16_{1-n}$ (e.g., AND gates, OR gates, NAND gates, XOR gates, latches, flip-flops, etc.) within a graphical representation of the circuit 18 being designed. During the design process, circuitry design system 10 provides contemporaneous feedback to designer 14 concerning one or more physical characteristics of the circuit 18 being designed.

Circuitry design system 10 includes an estimation process 20 for providing this feedback to designer 14. Estimation process 20 includes a parameter file maintenance process 22 for maintaining a circuit design parameter file 24 for the circuit 18 being designed by a circuit designer 14. This circuit design parameter file 24 specifies at least one physical characteristic 26 of the circuit 18. Examples of these physical characteristics 26 include the total silicon area required to construct the circuit being designed; the total number of gates required to construct the circuit being designed; the total number of transistors required to construct the circuit being designed; the total number of cells required to construct the circuit being designed; the total amount of power required to power the circuit being designed; etc. This list is not intend to be all inclusive, as these physical characteristics 26 can be any other physical characteristic (e.g., intrinsic capacitance) associated with circuit 18. Files 24 are stored on some form of data repository 28 (e.g., a hard drive, a database, etc.)

Estimation process 20 includes a design space monitoring process 30 for monitoring circuitry design system 10 (i.e., a design environment) to detect the addition of a circuitry component $16_{1-n}$ to the circuit 18 being designed by designer 14.

When design space monitoring process 30 determines that a circuitry component $16_{1-n}$ has been added, a component file access process 32 accesses a component design parameter file 34 for that circuitry component. This component design parameter file 34 specifies at least one design parameter 38 for that particular type of circuitry component. These files 34 are also stored on data repository 30.

Each circuitry component $16_{1-n}$ added to circuit 18 is of a specific type (e.g., AND gate, OR gate, NAND gate, XOR gate, latch, d-flop, sr-flop, etc.). When a component $16_{1-n}$ is added to circuit 18, component file access process 32 first determines the type of circuitry component and then accesses a component design parameter file 34 for that particular type of circuitry component. For example, if designer 14 added a buffer 36 to circuit 18, design space monitoring process 30 would detect the addition of this buffer 36 to circuit 18. Component file access process 32 would then analyze this newly-added circuitry component 36 and determine that it is a buffer. Component file access process 32 would then retrieve the component design parameter file 34 for this particular type of circuitry component (i.e., a buffer). This file 34 would include at least one design parameter 38 specific for a buffer. Design parameter(s) 38 are related to the physical characteristic(s) 26 of circuit 18, as enumerated in circuit design parameter file 24. However, these design parameters 38 specify the physical characteristic as it relates to the discrete component $16_{1-n}$ being added and not the physical characteristic of the entire circuit 18. For example, if the physical characteristic 26 is the number of gates required to build the entire circuit, the design parameter 38 would be the number of gates required to build just the circuitry component being added.

Typically, higher-level circuitry components are produced by assembling lower-level circuitry components. For example, three-input AND gate 40 is typically constructed from two two-input AND gates 42 and 44 placed in series. Additionally, a buffer (e.g., buffer 36) can be constructed from a two-input AND gate 46 with its input terminals tied together to form a single input. Accordingly, prior to installing buffer 36, circuit 18 has two buffers 48 and 50 and a three input AND gate 40. Therefore, the gate count of this circuit (in its current state) is four gates, namely one gate for each buffer 48 and 50 and two gates for the three-input AND gate 40.

Continuing with the above-stated example, when user 14 adds buffer 36 to circuit 18, the component design parameter file 34 for this buffer would indicate (via its design parameter 38) that this buffer 36 is constructed of a single gate. Therefore, the addition of buffer 36 to circuit 18 would add one additional gate to the total gate count for circuit 18. Accordingly, after buffer 36 is added to circuit 18, the physical characteristic 26 (i.e., the gate count) of circuit 18 (as specified in circuit design parameter file 24) would be changed from four to five.

Accordingly, a parameter file updating process 52 updates this circuit design parameter file 24 based on design parameter 38. Namely, since one buffer 36 is being added to circuit 18 and this buffer (pursuant to its design parameter 38) is constructed from one gate, the circuit design parameter file 24 will be updated to reflect the additional gate required to construct circuit 18. In this particular example, this gate count represents the physical characteristic 26 specified in circuit design parameter file 24.

Allowing designer 14 to keep track of this physical characteristic (i.e., the gate count) allows the designer 14 to structure their design to meet (and not exceed) the physical capacities (e.g., size, maximum gate count, maximum transistor count, maximum cell count, maximum power draw, etc.) of the silicon wafer.

A feedback display process 54 provides designer 14 with feedback concerning the physical characteristic 26 being monitored by estimation process 20. This feedback can be automatically provided to designer 14, in that each time a circuitry component $16_{1-n}$ is added to circuit 18, feedback concerning this newly-updated physical characteristic 26 is displayed on the screen of computer 12. Alternatively, a feedback request process 56 may be incorporated into estimation process 20 so that feedback is only provided to designer 14 when they request the information. This request can be in the form of positioning the mouse pointer 58 over the newly-added device (i.e., buffer 36) so that a text box 60 appears which specifies the physical characteristic(s) 26 being monitored (in this example, the gate count). As an alternative, some other form of key strokes or mouse clicks can be indicative of a request by designer 14 to receive feedback concerning physical characteristic 26.

It is foreseeable that designer 14 may have to reconfigure circuit 18 during the design process and, therefore, circuitry components $16_{1-n}$ may have to be deleted. Accordingly, design space monitoring process 30 is also configured to monitor circuitry design system 10 (i.e., the design environment) to detect the deletion of a circuitry component $16_{1-n}$ from the circuit 18 being designed. Further, component file access process 32 is configured to access a component design parameter file 24 that specifies at least one design parameter 26 for that deleted circuitry component. Additionally, parameter file updating process 52 is configured to update the circuit design parameter file 24 based on the design parameter(s) 38 included in the component design parameter file 34 for the deleted circuitry component.

As stated above, the physical characteristic 26 specified in circuit design parameter file 24 can be, among other things, the total silicon area required to construct the circuit being designed; the total number of gates required to construct the circuit being designed; the total number of transistors required to construct the circuit being designed; the total number of cells required to construct the circuit being designed; the total amount of power required to power the circuit being designed; etc.

Accordingly, estimation process 20 includes various processes 62, 64, 66, 98, and 100 for calculating and monitoring these various physical characteristics of circuit 18.

When the physical characteristic 26 is the total silicon wafer area required to construct the circuit being designed, the related design parameter 38 specified in component design parameter file 34 would be the silicon area required to construct the added circuitry component.

In this case, parameter file updating process 52 includes an area recalculation process 62 for recalculating the total silicon area required to construct the circuit 18 being designed so that it includes the silicon area required to construct the added circuitry component.

Continuing with the above-stated example, when designer 14 adds buffer 36 to circuit 18, the design parameter 38 in component design parameter file 34 would specify the amount of silicon wafer surface area required to produce buffer 36. Accordingly, area recalculation process 62 sums the required surface area of circuit 18 prior to the addition of buffer 36 and the additional surface area required for buffer 36, to generate the new required surface area. Parameter file updating process 52 would then update circuit design parameter file 24 to reflect this new surface area.

When the physical characteristic 26 is the total number of gates required to construct the circuit being designed, the related design parameter 38 specified in component design parameter file 34 would be the number of gates required to construct the added circuitry component. In this case, parameter file updating process 52 includes a gate recalculation process 64 for recalculating the total number of gates required to construct the circuit 18 being designed so that it includes the number of gates required to construct the added circuitry component.

Continuing with the above-stated example, when designer 14 adds buffer 36 to circuit 18, the design parameter 38 in component design parameter file 34 would specify that buffer 36 is constructed from one gate. Accordingly, gate recalculation process 64 sums the number of gates required to construct circuit 18 prior to the addition of buffer 36 (namely four) and the number of gates required to construct buffer 36 (namely one), to generate the new required number of gates (namely five). Parameter file updating process 52 would then update circuit design parameter file 24 to reflect this new gate count.

When the physical characteristic 26 is the total number of transistors required to construct the circuit being designed, the related design parameter 38 specified in component design parameter file 34 would be the number of transistors required to construct the added circuitry component Transistors (of various types, MOSFETS, BJT, Heterostructures, etc.) are the building blocks of semiconductor circuits. In logic circuits, transistors act as switches to allow circuits to switch between binary states. Generally, AND gates, OR gates, NAND gates, XOR gates, latches, flip-flops, etc., are all constructed of transistors.

In this case (when the physical characteristic is a transistor count), parameter file updating process 52 includes a transistor recalculation process 66 for recalculating the total number of transistors required to construct the circuit 18 being designed so that it includes the number of transistors required to construct the added circuitry component.

Figure 3:
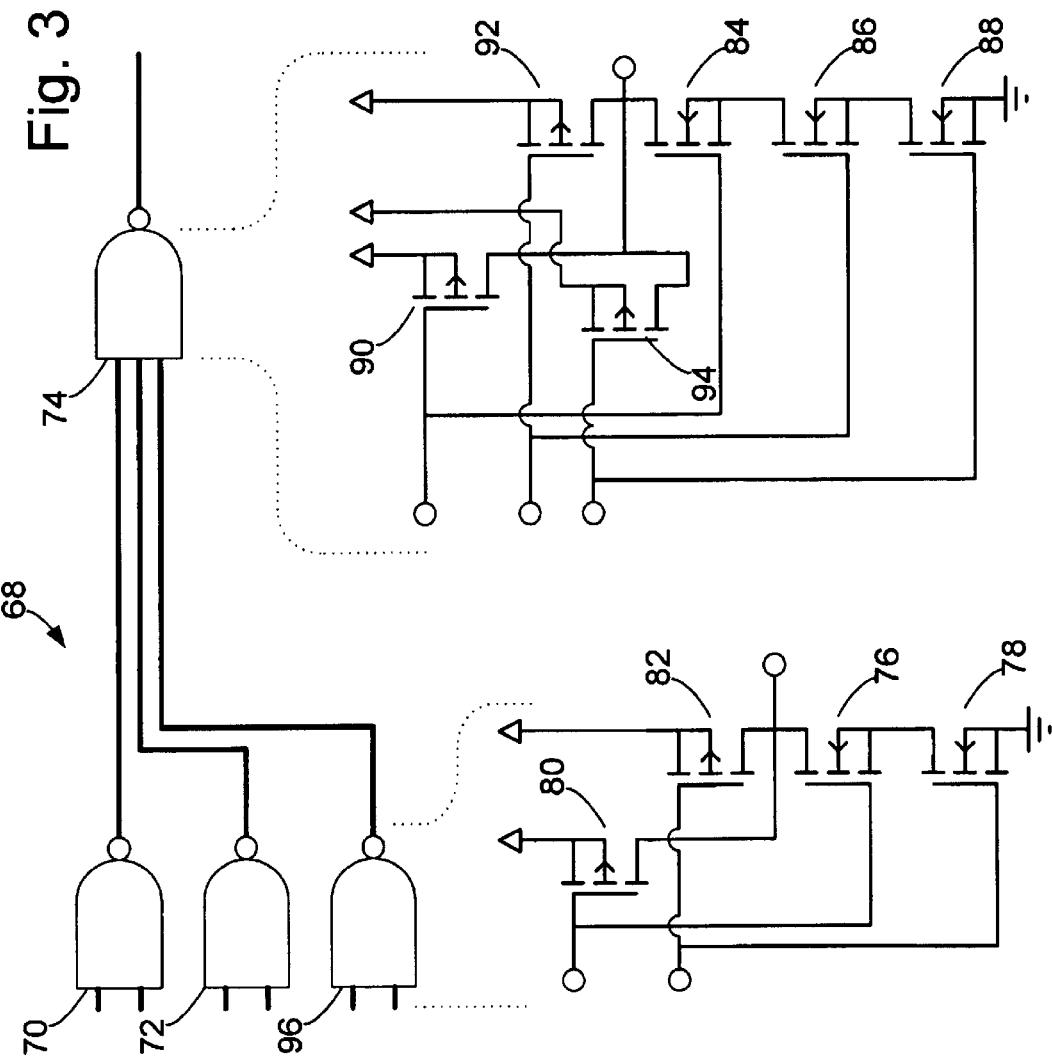
FIG. 3 is another diagrammatic view of the design space of the estimation process.

Referring to FIGS. 1 and 3 and continuing with the above-stated example, circuit 68 in its current state has two, two-input NAND gates 70 and 72 connected to one, three-input NAND gate 74. The two, two-input NAND gates 70 and 72 can each be constructed from a pair of n-channel MOSFETs 76 and 78 and a pair of p-channel MOSFETs 80 and 82. Further, three-input NAND gate 74 can be constructed from three n-channel MOSFETs 84, 86, and 88 and three p-channel MOSFETs 90, 92, and 94. Accordingly, circuit 68 (in its current state) is constructed of fourteen transistors (four for each two-input NAND gate and six for the three-input NAND gate).

When designer 14 adds a third two-input NAND gate 96 to circuit 68, the design parameter 26 in component design parameter file 24 would specify that NAND gate 96 is constructed from four transistors. Accordingly, transistor recalculation process 66 sums the number of transistors required to construct circuit 68 prior to the addition of NAND gate 96 (namely fourteen) and the number of transistors required to construct NAND gate 96 (namely four), to generate the new required number of transistors (namely eighteen). Parameter file updating process 52 would then update circuit design parameter file 24 to reflect this new transistor count.

When the physical characteristic 26 is the total number of cells required to construct the circuit being designed, the related design parameter 38 specified in component design parameter file 34 would be the number of cells required to construct the added circuitry component Cells are specific designated area on the surface of a silicon wafer, such that these areas can be etched (via photolithography) to produce a finite number of devices. These devices can be (on a macro level) circuitry components such as AND gates, OR gates, NAND gates, XOR gates, latches, flip-flops, etc. Alternatively, these devices can be (on a micro level), the transistors which are used to construct the circuitry components. Accordingly, a cell may be capable of having, for example, five transistors.

In this case (when the physical characteristic is a cell count), parameter file updating process 52 includes a cell recalculation process 98 for recalculating the total number of cells required to construct the circuit 68 being designed so that it includes the number of cells required to construct the added circuitry component.

As stated above, circuit 68 (prior to being modified) is constructed of fourteen transistors. If a maximum of five transistors can be incorporated into each transistor, circuit 68 (in its current state) would require three cells. When designer 14 adds a third two-input NAND gate 96 to circuit 68, the design parameter 38 in component design parameter file 34 would specify that NAND gate 96, which is constructed from four transistors that would require one cell. Accordingly, cell recalculation process 98 sums the number of cells required to construct circuit 68 prior to the addition of NAND gate 96 (namely three) and the number of cells required to construct NAND gate 96 (namely one), to generate the new required number of cells (namely four). Parameter file updating process 52 would then update circuit design parameter file 24 to reflect this new cell count.

When the physical characteristic 26 is the total amount of power required to power the circuit being designed, the related design parameter 38 specified in component design parameter file 34 would be the amount of power required to power the added circuitry component.
Each electronic device consumes electrical power during use. For illustrative purposes, let's assume that a transistor requires one milliwatt of power to function properly.

In this case (when the physical characteristic is power consumption), parameter file updating process 52 includes a power recalculation process 100 for recalculating the total amount of power required to power the circuit 68 being designed so that it includes the amount of power required to power the added circuitry component.

As stated above, circuit 68 (prior to being modified) is constructed of fourteen transistors. If each of these transistors has a maximum power consumption of 1 milliwatt, the original incarnation of this circuit consumes a maximum of fourteen milliwatts. When designer 14 adds a third two-input NAND gate 96 to circuit 68, the design parameter 38 in component design parameter file 34 would specify that NAND gate 96, which is constructed from four transistors, would consume a maximum of four milliwatts. Accordingly, power recalculation process 100 sums the total amount of power required to power circuit 68 prior to the addition of NAND gate 96 (namely fourteen milliwatts) and the amount of power required to power NAND gate 96 (namely four milliwatts), to generate the new required amount of power namely eighteen milliwatts). Parameter file updating process 52 would then update circuit design parameter file 24 to reflect this new power requirement.

As stated above, the physical characteristic 26 specified in circuit design parameter file 24 can be, among other things, the total silicon area required to construct the circuit being designed; the total number of gates required to construct the circuit being designed; the total number of transistors required to construct the circuit being designed; the total number of cells required to construct the circuit being designed; the total amount of power required to power the circuit being designed; etc. While thus far, estimation process 20 has been shown to provide feedback to designer 14 concerning only one of these physical characteristics 26, this is for illustrative purposes only and is not intended to be a limitation of the invention. Specifically, estimation process 20 can provide feedback to designer 14 concerning as many (or as few) physical characteristics 26 as needed, required, or desired.

Figure 4:
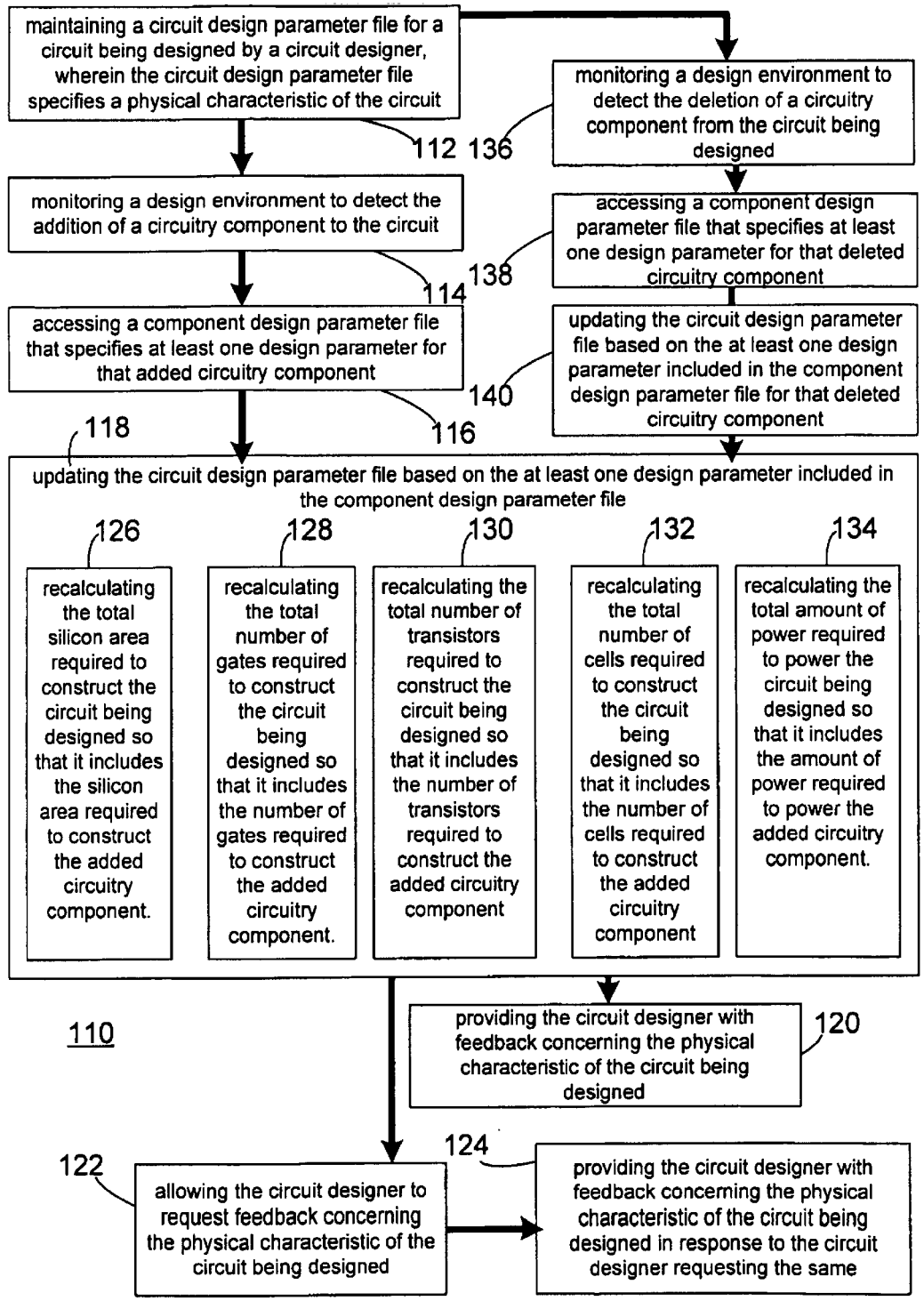
FIG. 4 is a diagrammatic view of the estimation method.

Referring to FIG. 4, there is shown an estimation method 110 that maintains 112 a circuit design parameter file for a circuit being designed by a circuit designer. The circuit design parameter file specifies a physical characteristic of the circuit. Method 110 monitors 114 a design environment to detect the addition of a circuitry component to the circuit. Method 110 accesses 116 a component design parameter file that specifies at least one design parameter for that added circuitry component and updates 118 the circuit design parameter file based on the at least one design parameter included in the component design parameter file.

Method 110 provides 120 the circuit designer with feedback concerning the physical characteristic of the circuit being designed. Method 110 allows 122 the circuit designer to request feedback concerning the physical characteristic of the circuit being designed and provides 124 the circuit designer with feedback concerning the physical characteristic of the circuit being designed in response to the circuit designer requesting the same.

The physical characteristic is the total silicon area required to construct the circuit being designed and the at least one design parameter is the silicon area required to construct the added circuitry component. Updating 118 the circuit design parameter file includes recalculating 126 the total silicon area required to construct the circuit being designed so that it includes the silicon area required to construct the added circuitry component.

The physical characteristic is the total number of gates required to construct the circuit being designed and the at least one design parameter is the number of gates required to construct the added circuitry component. Updating 118 the circuit design parameter file includes recalculating 128 the total number of gates required to construct the circuit being designed so that it includes the number of gates required to construct the added circuitry component.

The physical characteristic is the total number of transistors required to construct the circuit being designed and the at least one design parameter is the number of transistors required to construct the added circuitry component. Updating 118 the circuit design parameter file includes recalculating 130 the total number of transistors required to construct the circuit being designed so that it includes the number of transistors required to construct the added circuitry component.

The physical characteristic is the total number of cells required to construct the circuit being designed and the at least one design parameter is the number of cells required to construct the added circuitry component. Updating 118 the circuit design parameter file includes recalculating 132 the total number of cells required to construct the circuit being designed so that it includes the number of cells required to construct the added circuitry component.

The physical characteristic is the total amount of power required to power the circuit being designed and the at least one design parameter is the amount of power required to power the added circuitry component. Updating 118 the circuit design parameter file includes recalculating 134 the total amount of power required to power the circuit being designed so that it includes the amount of power required to power the added circuitry component.

Method 110 further includes monitoring 136 a design environment to detect the deletion of a circuitry component from the circuit being designed. Method 110 further includes accessing 138 a component design parameter file that specifies at least one design parameter for that deleted circuitry component. Method 110 further includes updating 140 the circuit design parameter file based on the at least one design parameter included in the component design parameter file for that deleted circuitry component.

Figure 5:
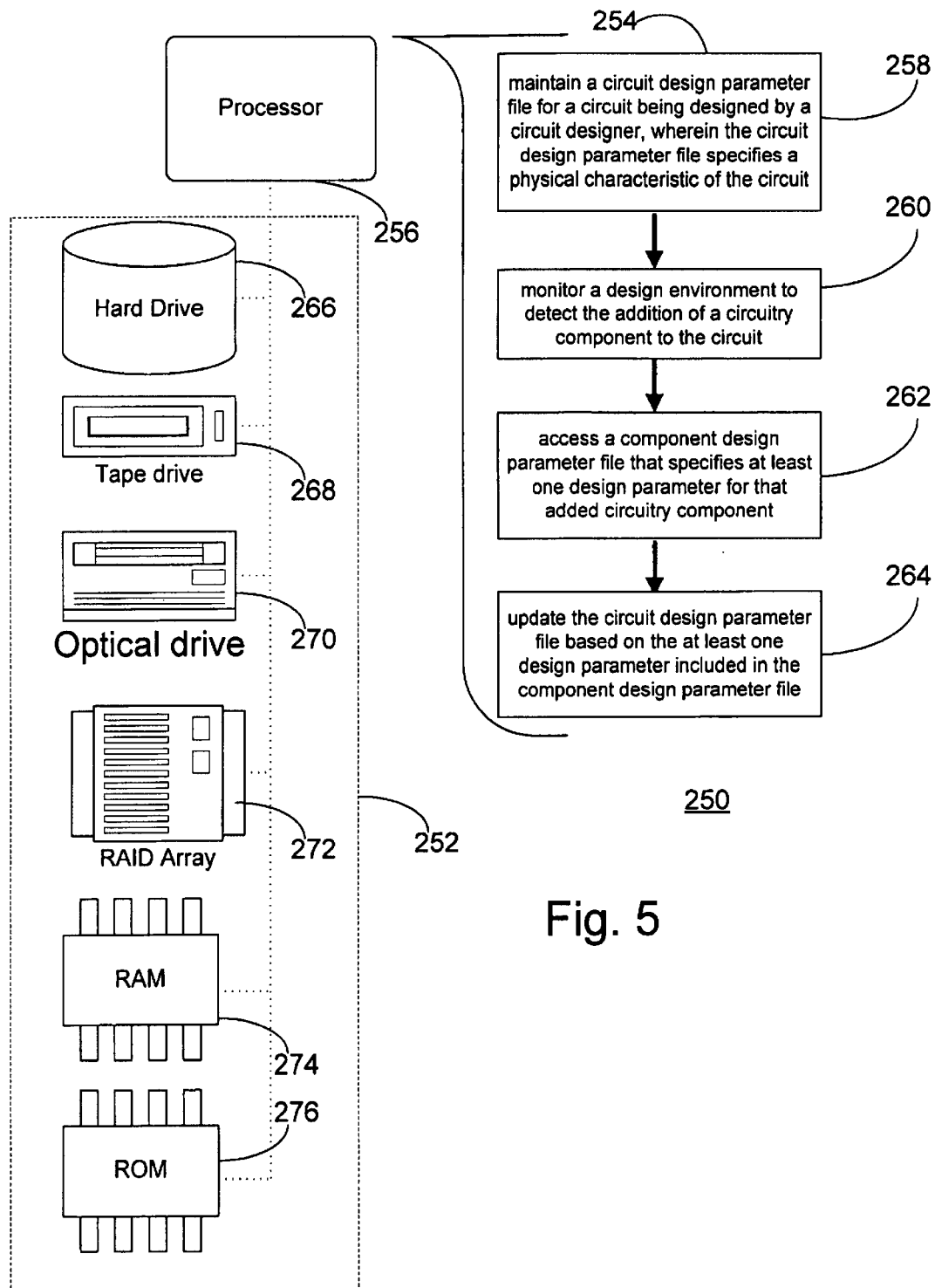
FIG. 5. is a diagrammatic view of another embodiment of the estimation process, including a processor and a computer readable medium.

Referring to FIG. 5, there is shown a computer program product 250 residing on a computer readable medium 252 having a plurality of instructions 254 stored thereon. When executed by processor 256, instructions 254 cause processor 256 to maintains 258 a circuit design parameter file for a circuit being designed by a circuit designer. The circuit design parameter file specifies a physical characteristic of the circuit. Computer program product 250 monitors 260 a design environment to detect the addition of a circuitry component to the circuit. Computer program product 250 accesses 262 a component design parameter file that specifies at least one design parameter for that added circuitry component and updates 264 the circuit design parameter file based on the at least one design parameter included in the component design parameter file.

Typical embodiments of computer readable medium 252 are: hard drive 266; tape drive 268; optical drive 270; RAID array 272; random access memory 274; and read only memory 276.

Figure 6:
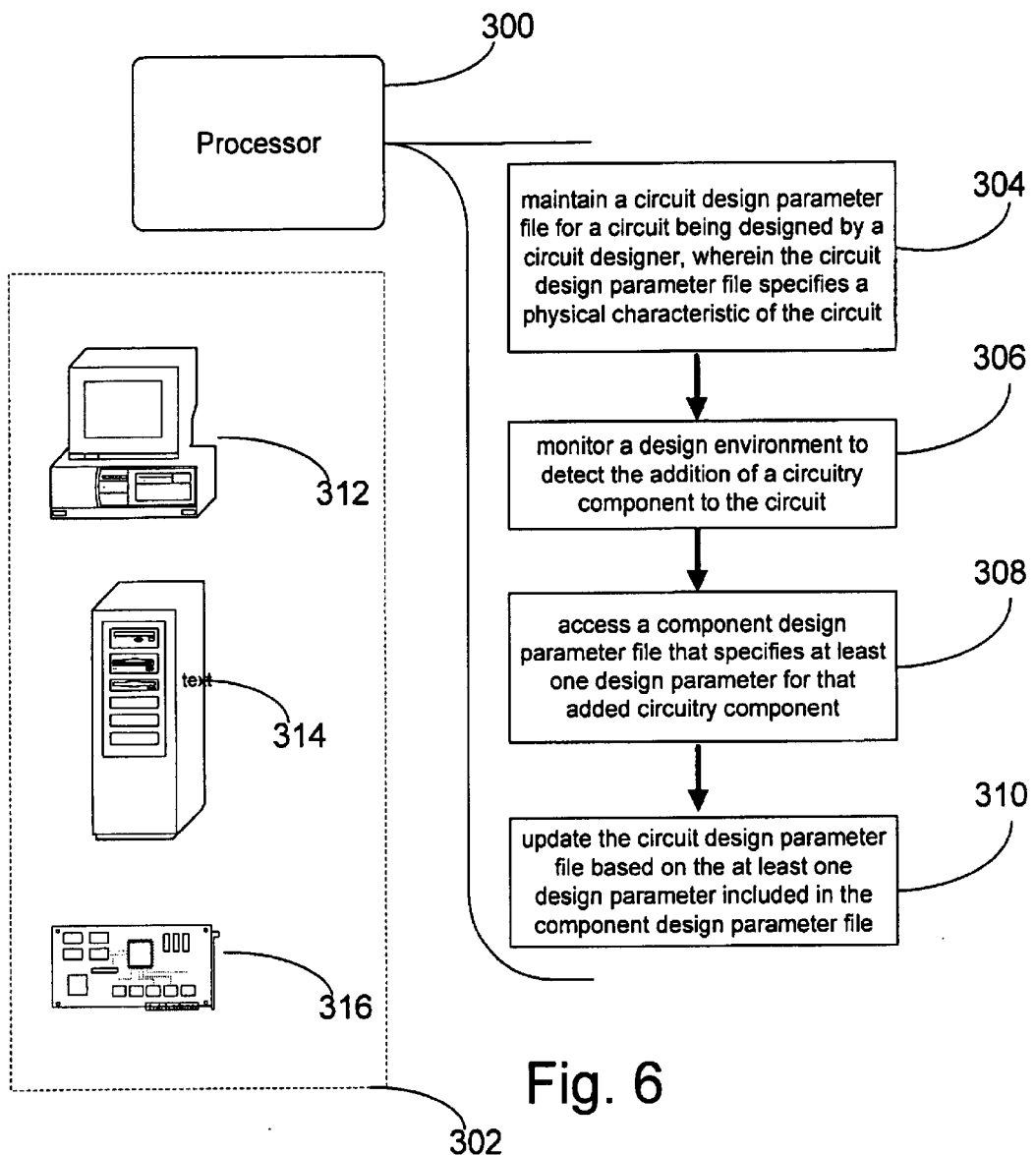
FIG. 6. is a diagrammatic view of another embodiment of the estimation process, including a processor and memory.

Now referring to FIG. 6, there is shown a processor 300 and memory 302 configured to maintain 304 a circuit design parameter file for a circuit being designed by a circuit designer. The circuit design parameter file specifies a physical characteristic of the circuit. Processor 300 and memory 302 monitor 306 a design environment to detect the addition of a circuitry component to the circuit. Processor 300 and memory 302 access 308 a component design parameter file that specifies at least one design parameter for that added circuitry component and update 310 the circuit design parameter file based on the at least one design parameter included in the component design parameter file.

Processor 300 and memory 302 may be incorporated into a personal computer 312, a network server 314, or a single board computer 316.

Other embodiments are within the scope of the following claims.

What is claimed is:

1. A method of designing a semiconductor device, the method comprising:
providing a plurality of component design parameter files in a data repository, each of the component design parameter files associated with a discrete circuitry component and including an estimated silicon area required to construct the discrete component, the circuitry components including at least some components selected from the group consisting of an AND gate, an OR gate, a NAND gate, a NOR gate, an XOR gate, a latch, and a flip-flop;

maintaining a circuit design parameter file for a circuit being designed, the circuit design parameter file specifying an estimated total silicon area for the circuit being designed;

monitoring a design environment to detect the addition of a circuitry component to the circuit;

determining a type of circuitry component added to the circuit being designed;

accessing a component design parameter file associated with the determined type of circuitry component that specifies the estimated silicon area required to construct the added circuitry component;

updating the circuit design parameter, wherein updating includes adding the specified estimated silicon area required to construct the added circuitry component to the estimated total silicon area maintained in the circuit design parameter file so that the estimated total silicon area includes the silicon area required to construct the added circuitry component;

providing the circuit designer with feedback concerning the estimated total silicon area of the circuit being designed;

monitoring a design environment to detect the deletion of a circuitry component from the circuit being designed; and accessing a component design parameter file that specifies the total silicon area for the deleted circuitry component.

2. The method of claim 1 further comprising allowing the circuit designer to request feedback concerning the estimated total silicon area of the circuit being designed.

3. The method of claim 2 further comprising providing the circuit designer with feedback concerning the estimated total silicon area of the circuit being designed in response to the circuit designer requesting feedback.

4. The method of claim 1 further comprising updating the circuit design parameter file based on the total silicon area included in the component design parameter file for that deleted circuitry component.

5. A method of designing a semiconductor device, the method comprising:
providing a plurality of component design parameter files in a data repository, each of the component design parameter files associated with a discrete circuitry component and including a number of gates required to construct the discrete component, the circuitry components including at least some components selected from the group consisting of an AND gate, an OR gate, a NAND gate, a NOR gate, an XOR gate, a latch, and a flip-flop;

maintaining a circuit design parameter file for a circuit being designed, the circuit design parameter file specifying total number of gates required to construct the circuit being designed;

monitoring a design environment to detect the addition of a circuitry component to the circuit;

determining a type of circuitry component added to the circuit being designed;

accessing a component design parameter file associated with the determined type of circuitry component that specifies number of gates required to construct the determined type of circuitry component;

updating the circuit design parameter, wherein updating includes adding the specified number of gates required to construct the determined type of circuitry component to the estimated number of gates required to construct the circuit being designed maintained in the circuit design parameter file so that the estimated total number of gates required to construct the circuit being designed includes the number of gates required to construct the added circuitry component;

providing the circuit designer with feedback concerning the estimated total number of gates required to construct the circuit being designed;

monitoring a design environment to detect the deletion of a circuitry component from the circuit being designed; and accessing a component design parameter file that specifies the total number of gates for a deleted circuitry component.

6. The method of claim 5 further comprising allowing the circuit designer to request feedback concerning the estimated total number of gates required to construct the circuit being designed.

7. The method of claim 6 further comprising providing the circuit designer with feedback concerning the estimated total number of gates required to construct the circuit being designed in response to the circuit designer requesting feedback.

8. The method of claim 5 further comprising updating the circuit design parameter file based on the total number of gates included in the component design parameter file for that deleted circuitry component.

9. A method of designing a semiconductor device, the method comprising:

providing a plurality of component design parameter files in a data repository, each of the component design parameter files associated with a discrete circuitry component and including a number of transistors required to construct the discrete component, the circuitry components including at least some components selected from the group consisting of an AND gate, an OR gate, a NAND gate, a NOR gate, an XOR gate, a latch, and a flip-flop;

maintaining a circuit design parameter file for a circuit being designed, the circuit design parameter file specifying total number of transistors required to construct the circuit being designed;

monitoring a design environment to detect the addition of a circuitry component to the circuit;

determining a type of circuitry component added to the circuit being designed;

accessing a component design parameter file associated with the determined type of circuitry component that specifies number of transistors required to construct the determined type of circuitry component;

updating the circuit design parameter, wherein updating includes adding the specified number of transistors required to construct the determined type of circuitry component to the estimated number of transistors required to construct the circuit being designed maintained in the circuit design parameter file so that the estimated total number of transistors required to construct the circuit being designed includes the number of transistors required to construct the added circuitry component; and providing the circuit designer with feedback concerning the estimated total number of transistors required to construct the circuit being designed.

10. The method of claim 9 further comprising allowing the circuit designer to request feedback concerning the estimated total number of transistors required to construct the circuit being designed.

11. The method of claim 10 further comprising providing the circuit designer with feedback concerning the estimated total number of transistors required to construct the circuit being designed in response to the circuit designer requesting feedback.

12. The method of claim 9 further comprising monitoring a design environment to detect the deletion of a circuitry component from the circuit being designed.

13. The method of claim 12 further comprising accessing a component design parameter file that specifies at number of transistors for that deleted circuitry component.

14. The method of claim 13 further comprising updating the circuit design parameter file based on the number of transistors included in the component design parameter file for that deleted circuitry component.

* * * * *